United States Patent
Takata

(10) Patent No.: US 10,763,824 B2
(45) Date of Patent: Sep. 1, 2020

(54) HIGH-FREQUENCY FILTER AND MULTIPLEXER

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 43 days.

(21) Appl. No.: 16/186,747

(22) Filed: Nov. 12, 2018

(65) Prior Publication Data
US 2019/0158061 A1 May 23, 2019

(30) Foreign Application Priority Data

Nov. 20, 2017 (JP) ................................. 2017-223044

(51) Int. Cl.
| | |
|---|---|
| H03H 9/64 | (2006.01) |
| H03H 9/54 | (2006.01) |
| H03H 9/205 | (2006.01) |
| H03H 9/00 | (2006.01) |
| H03H 9/72 | (2006.01) |

(52) U.S. Cl.
CPC ........ *H03H 9/6483* (2013.01); *H03H 9/0004* (2013.01); *H03H 9/205* (2013.01); *H03H 9/542* (2013.01); *H03H 9/725* (2013.01)

(58) Field of Classification Search
CPC ...... H03H 9/6483; H03H 9/725; H03H 9/205; H03H 9/0004; H03H 9/706; H03H 9/542
USPC .......................... 333/133, 187, 188, 193–196
See application file for complete search history.

(56) References Cited

U.S. PATENT DOCUMENTS

| 6,262,637 B1* | 7/2001 | Bradley ................. H03H 9/568 310/322 |
| 7,642,882 B2* | 1/2010 | Nam ...................... H03H 9/105 333/133 |
| 2003/0076195 A1* | 4/2003 | Ishizaki .................... H01P 1/20 333/133 |

(Continued)

FOREIGN PATENT DOCUMENTS

| JP | 2006-506881 A | 2/2006 |
| JP | 2006-279602 A | 10/2006 |
| JP | 2007-089193 A | 4/2007 |

(Continued)

OTHER PUBLICATIONS

Machine English Translation of KR2019890003741 published on Apr. 1989 (Year: 1989).*

(Continued)

*Primary Examiner* — Robert J Pascal
*Assistant Examiner* — Jorge L Salazar, Jr.
(74) *Attorney, Agent, or Firm* — Keating & Bennett, LLP

(57) ABSTRACT

A ladder filter includes at least one series arm resonator connected in a path between first and second input/output terminals, at least two parallel arm resonators each connected between a connection node in the path and a ground, and an inductor connected in series to the at least one series arm resonator. The inductor is closer to the first input/output terminal than are the at least one series arm resonator and the at least two parallel arm resonators. Of the at least two parallel arm resonators, a first parallel arm resonator connected closest to the second input/output terminal has the highest anti-resonant frequency.

13 Claims, 10 Drawing Sheets

(56) References Cited

U.S. PATENT DOCUMENTS

2006/0055485 A1   3/2006   Lobeek

FOREIGN PATENT DOCUMENTS

| | | |
|---|---|---|
| JP | 2011-097223 A | 5/2011 |
| KR | 20-1989-0003741 U | 4/1989 |
| KR | 10-0190617 B1 | 6/1999 |
| KR | 10-2005-0075433 A | 7/2005 |
| WO | 2017/159834 A1 | 9/2017 |

OTHER PUBLICATIONS

Official Communication issued in corresponding Korean Patent Application No. 10-2018-0137050, dated Dec. 19, 2019.
Official Communication issued in Japanese Patent Application No. 2017-223044, dated Mar. 10, 2020.

\* cited by examiner

[Ant END]

freq(1930MHz to 1995MHz)
Center: 50Ω

[Rx END]

freq(1930MHz to 1995MHz)
Center: 50Ω

HIGH-FREQUENCY FILTER AND MULTIPLEXER

CROSS REFERENCE TO RELATED APPLICATIONS

This application claims the benefit of priority to Japanese Patent Application No. 2017-223044 filed on Nov. 20, 2017. The entire contents of this application are hereby incorporated herein by reference.

BACKGROUND OF THE INVENTION

1. Field of the Invention

The present invention relates to a high-frequency filter and a multiplexer.

2. Description of the Related Art

A multiplexer includes a plurality of filters connected in common to a common terminal which is further connected to an antenna. To reduce insertion loss, ladder filters have been used in such multiplexers. In this case, impedance as viewed from the common terminal is typically matched to, for example, 50Ω. A configuration for this purpose is disclosed, for example, in Japanese Unexamined Patent Application Publication No. 2006-506881, in which an inductor is connected in series in the path between a common terminal and a reception filter.

Specifically, the filter is designed such that before the inductor is connected, the resistance of the impedance is 50Ω and the reactance of the impedance is negative (capacitive). Then, when the inductor is connected, the resistance of the impedance stays at 50Ω and the reactance of the impedance becomes substantially zero. This improves the voltage standing wave ratio (VSWR) and improves the bandpass characteristics of the filter in the pass band.

High-frequency filters have been typically designed to have a characteristic impedance of 50Ω. In this case, in high-frequency filters including acoustic wave resonators except a longitudinally coupled filter, impedance as viewed from one input/output terminal and impedance as viewed from the other input/output terminal are both 50Ω. However, the input or output impedance of some peripheral components connected to the high-frequency filter may not be 50Ω. This means that impedance matching is required between the high-frequency filter and such peripheral components. For example, the input impedance of a low-noise amplifier (LNA) connected to a reception filter (high-frequency filter) is typically higher than 50Ω. Therefore, the impedance as viewed from one input/output terminal (e.g., from the LNA) needs to be higher than the impedance as viewed from the other input/output terminal (e.g., from a common terminal or antenna).

However, making the impedance of the high-frequency filter as viewed from the LNA higher than the impedance as viewed from the antenna requires a more complex matching element. Using such a complex matching element not only degrades the insertion loss, but also leads to increased size of the high-frequency filter.

SUMMARY OF THE INVENTION

Preferred embodiments of the present invention provide high-frequency filters and multiplexers in which, with a less complex matching element, impedance as viewed from one input/output terminal is able to be made higher than impedance as viewed from the other input/output terminal.

A high-frequency filter according to a preferred embodiment of the present invention is a high-frequency ladder filter. The high-frequency filter includes at least one series arm resonator connected in a path between a first input/output terminal and a second input/output terminal; at least two parallel arm resonators each connected between a connection node in the path and a ground; and an inductor connected in series to the at least one series arm resonator, the inductor being closer to the first input/output terminal than the at least one series arm resonator and the at least two parallel arm resonators are to the first input/output terminal. Of the at least two parallel arm resonators, a first parallel arm resonator connected closest to the second input/output terminal has the highest anti-resonant frequency.

Of the at least two parallel arm resonators included in the high-frequency filter, the first parallel arm resonator is closest to the second input/output terminal and most significantly influences the impedance as viewed from the second input/output terminal of the high-frequency filter. Also, since having the highest anti-resonant frequency of the at least two parallel arm resonators, the first parallel arm resonator defines and functions as an inductive element in most portions of the pass band of the high-frequency filter.

The high-frequency filter is designed such that the impedance thereof is capacitive before the inductor and the first parallel arm resonator are connected. Specifically, the high-frequency filter is designed such that in a Smith chart, the impedance is located at a position reached by moving along, for example, a 50Ω constant resistance circle counterclockwise from a point at which reactance is zero. In other words, the high-frequency filter is designed such that in an admittance chart, the impedance is located on a constant conductance circle passing through a point at which resistance is higher than about 50Ω and reactance is about zero. Thus, when the inductor is connected, the impedance as viewed from the first input/output terminal moves clockwise along the 50Ω constant resistance circle in the Smith chart to a position at which resistance is about 50Ω and reactance is about zero. Also, when the first parallel arm resonator is connected, the impedance as viewed from the second input/output terminal moves counterclockwise along a constant conductance circle passing through a point at which resistance is higher than about 50Ω and reactance is about zero in the admittance chart to a position at which resistance is higher than about 50Ω and reactance is about zero. This simply involves using the inductor as a matching element. Thus, with a less complex matching element, the impedance as viewed from one input/output terminal (second input/output terminal) is able to be made higher than the impedance as viewed from the other input/output terminal (first input/output terminal). Specifically, the resistance of the impedance as viewed from the second input/output terminal is able to be made higher than about 50Ω and the reactance of the impedance as viewed from the second input/output terminal is able to be made about zero. This facilitates impedance matching, for example, between the high-frequency filter and an LNA.

In the high-frequency filter described above, the second input/output terminal and the connection node to which the first parallel arm resonator is connected may be connected, with none of the at least one series arm resonator interposed therebetween.

If a series arm resonator, which has an inductance component, is connected between the second input/output terminal and the connection node to which the first parallel arm resonator is connected, the impedance as viewed from the second input/output terminal is moved clockwise by the inductance component along the constant resistance circle in the Smith chart and is shifted to the lower impedance side. This weakens the effect of making the impedance as viewed from the second input/output terminal higher. When the second input/output terminal and the connection node to which the first parallel arm resonator is connected are connected, with no series arm resonator interposed therebetween, the impedance as viewed from the second input/output terminal is prevented from being lowered.

In the high-frequency filter described above, anti-resonant frequencies of the at least two parallel arm resonators may be in ascending order, with the anti-resonant frequency of one parallel arm resonator connected closer to the second input/output terminal being higher than the anti-resonant frequency of another parallel arm resonator connected closer to the first input/output terminal.

In this case, of the at least two parallel arm resonators, a parallel arm resonator closer to the second input/output terminal more significantly influences the impedance as viewed from the second input/output terminal of the high-frequency filter. Therefore, since a parallel arm resonator closer to the second input/output terminal has a higher anti-resonant frequency, the impedance as viewed from the second input/output terminal is able to be made higher.

A multiplexer according to a preferred embodiment of the present invention includes a plurality of filters including a high-frequency filter according to a preferred embodiment of the present invention, and the plurality of filters are each directly or indirectly connected, at one input/output terminal thereof, to a common terminal.

It is thus possible to provide a multiplexer in which, with a less complex matching element, impedance as viewed from one input/output terminal is able to be made higher than impedance as viewed from the other input/output terminal.

In the multiplexer described above, the first input/output terminal and the connection node to which one of the at least two parallel arm resonators is connected, the one being connected closest to the first input/output terminal, may be connected, with none of the at least one series arm resonator interposed therebetween.

When impedance outside the pass band of the high-frequency filter (e.g., in the pass band of another filter connected in common with the high-frequency filter to the common terminal) is high, interference between this filter and the high-frequency filter is able to be reduced or prevented. However, if any series arm resonator is connected between the first input/output terminal and the connection node to which the parallel arm resonator closest to the first input/output terminal is connected, the impedance in the pass band of the filter described above moves toward a capacitive phase and as a result, an inductor with a larger inductance value is required. When the first input/output terminal and the connection node to which the parallel arm resonator closest to the first input/output terminal is connected are connected, with no series arm resonator interposed therebetween, the inductance value of the inductor is able to be reduced. This reduction of the inductance value reduces loss and makes it possible to reduce the size of the high-frequency filter.

In the high-frequency filters and the multiplexers according to preferred embodiments of the present invention, it is possible, with a less complex matching element, to make impedance as viewed from one input/output terminal higher than impedance as viewed from the other input/output terminal.

The above and other elements, features, steps, characteristics and advantages of the present invention will become more apparent from the following detailed description of the preferred embodiments with reference to the attached drawings.

Figure 1:
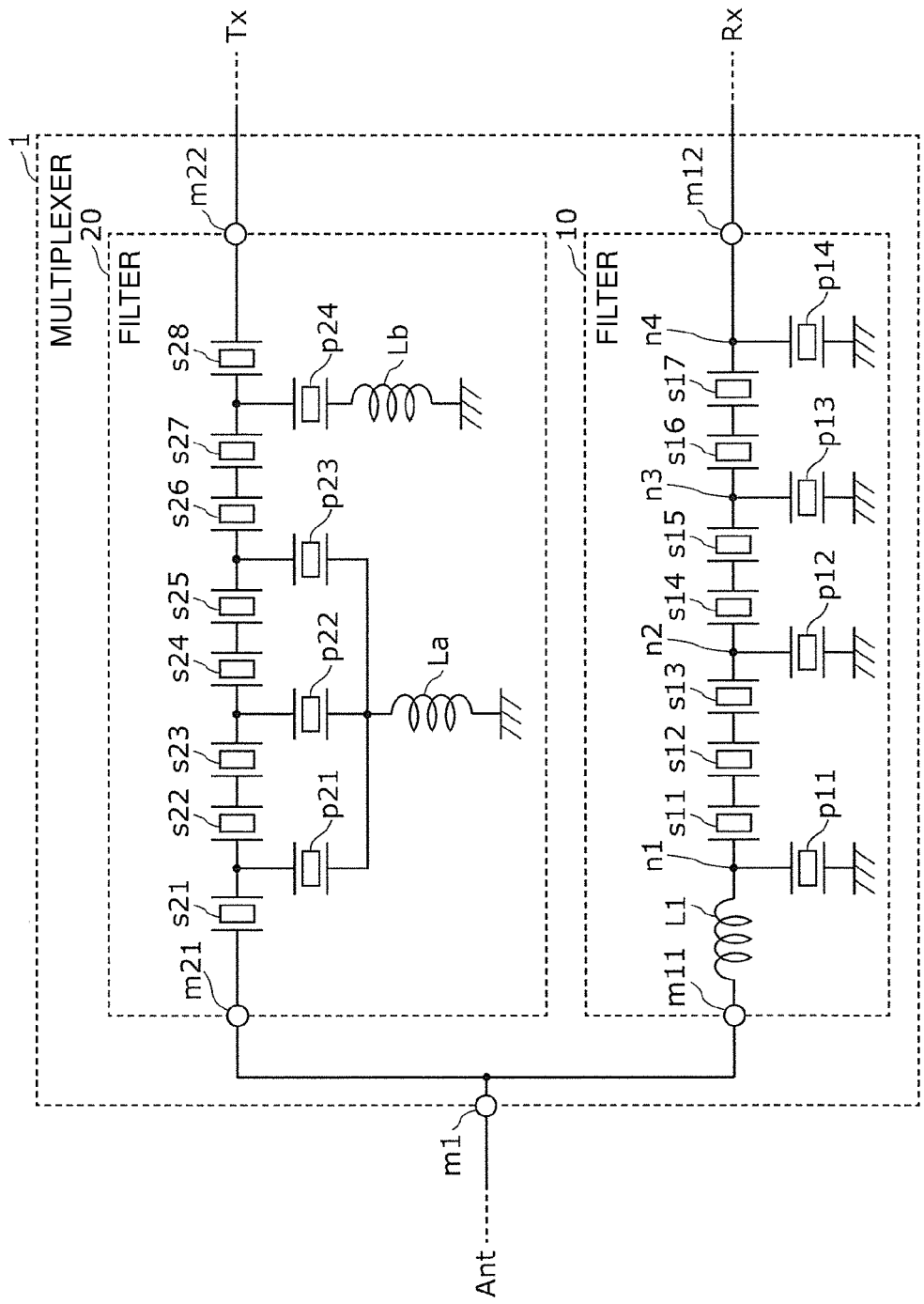
FIG. 1 is a circuit diagram of a multiplexer according to a preferred embodiment of the present invention.

DETAILED DESCRIPTION OF THE
PREFERRED EMBODIMENTS

Preferred embodiments of the present invention will be described in detail with reference to the drawings. Note that all preferred embodiments to be described provide either comprehensive or specific examples. Numerical values, shapes, materials, elements, and arrangements and connection structures of the elements that are presented in the following preferred embodiments are merely examples and are not intended to limit the scope of the present invention. Of the elements described in the following preferred embodiments, those not recited in the independent claims are explained as optional elements. Throughout the drawings, the same or substantially the same elements are denoted by the same reference numerals and their overlapping descriptions may be omitted or simplified.

First Preferred Embodiment

A configuration of a multiplexer according to a first preferred embodiment of the present invention will now be described.

FIG. 1 is a circuit diagram of a multiplexer 1 according to the first preferred embodiment.

The multiplexer 1 is a splitter/combiner that includes a plurality of filters. The plurality of filters including a ladder filter 10 (high-frequency filter) are connected in common, at respective input/output terminals (input/output terminals m11 and m21) thereof, to a common terminal m1. For example, the plurality of filters have different pass bands. In the present preferred embodiment, the multiplexer 1 is preferably a duplexer that includes two filters, for example. As illustrated in FIG. 1, the multiplexer 1 includes ladder filters 10 and 20. Although not shown, for example, an antenna element is connected to the common terminal m1, with a switching circuit interposed therebetween. The antenna element is preferably a multiband antenna that is compliant with a communication standard, such as the Long-Term Evolution (LTE), for example, and capable of transmitting and receiving high-frequency signals. In the present preferred embodiment, the antenna element is connected to the common terminal m1, with a switching circuit interposed therebetween. Although not shown, for example, a radio frequency (RF) signal processing circuit (or RF integrated circuit (RFIC)), for example, is connected to the other respective input/output terminals (input/output terminals m12 and m22) of the plurality of filters, with a switching circuit or amplifying circuit (e.g., power amplifier (PA) or low-noise amplifier (LNA)) interposed therebetween. The RFIC controls the filter used for communication. For example, carrier aggregation (CA) may be performed by simultaneously using the filters 10 and 20.

The filter 10 is a reception filter preferably having, for example, Band 25 Rx (about 1930 MHz to about 1995 MHz) of LTE as a pass band. The filter 10 is preferably, for example, a ladder acoustic wave filter. An LNA is connected to the input/output terminal m12 of the filter 10, which is a reception filter.

The filter 10 includes at least one series arm resonator connected in a path between the input/output terminal m11 (first input/output terminal) and the input/output terminal m12 (second input/output terminal). In the present preferred embodiment, the filter 10 includes series arm resonators s11 to s17 connected to one another in series.

The filter 10 also includes at least two parallel arm resonators, each connected between a connection node in the path and the ground. The connection node is a point of connection between elements or between an element and a terminal. In FIG. 1, connection nodes are each represented by a dot and denoted by n1 to n4. In the present preferred embodiment, the at least two parallel arm resonators included in the filter 10 are a parallel arm resonator p11 connected between the ground and a node n1 between an inductor L1 (described below) and the series arm resonator s11, a parallel arm resonator p12 connected between the ground and a node n2 between the series arm resonators s13 and s14, a parallel arm resonator p13 connected between the ground and a node n3 between the series arm resonators s15 and s16, and a parallel arm resonator p14 connected between the ground and a node n4 between the series arm resonator s17 and the input/output terminal m12.

Of the at least two parallel arm resonators (parallel arm resonators p11 to p14) included in the filter 10, the parallel arm resonator p14 (first parallel arm resonator) is connected closest to the input/output terminal m12. The parallel arm resonator p14, which is connected closest to the input/output terminal m12 of all the parallel arm resonators p11 to p14, is a resonator that most significantly influences the impedance as viewed from the input/output terminal m12 of the filter 10. Here, "the parallel arm resonator p14 is connected closest to the input/output terminal m12" means that the parallel arm resonator p14 is closest to the input/output terminal m12 in the circuit diagram. In other words, for example, on a substrate, the parallel arm resonator p14 does not necessarily need to be disposed closest to the input/output terminal m12 of all the parallel arm resonators p11 to p14.

The input/output terminal m12 and the node n4 to which the parallel arm resonator p14 is connected are connected, with none of the at least one series arm resonator interposed therebetween. In other words, no series arm resonator is connected on a side of the node n4 adjacent to the input/output terminal m12. This means that the filter 10 is preferably a ladder filter that extends from (or begins at) the parallel arm resonator p14 as viewed from the input/output terminal m12.

The input/output terminal m11 and the node n1 to which the parallel arm resonator p11, which is connected closest to the input/output terminal m11 of the at least two parallel arm resonators, is connected are connected, with none of the at least one series arm resonator interposed therebetween. In other words, no series arm resonator is connected on a side of the node n1 adjacent to the input/output terminal m11. This means that the filter 10 is preferably a ladder filter that extends from (or begins at) the parallel arm resonator p11 disposed after the inductor L1, as viewed from the input/output terminal m11.

The input/output terminal m11 and the common terminal m1, which are connected to the antenna element, are hereinafter also referred to as an Ant end. The input/output terminal m12, to which a reception circuit (e.g., LNA) is connected, is hereinafter also referred to as an Rx end.

The at least one series arm resonator and the at least two parallel arm resonators are preferably, for example, resonators using acoustic waves, such as resonators using surface acoustic waves (SAWs), resonators using bulk acoustic waves (BAWs), or film bulk acoustic resonators (FBARs). SAWs include boundary waves as well as surface waves.

The resonators described herein are preferably SAW resonators, for example. Thus, since the filter includes interdigital transducer (IDT) electrodes on a substrate having piezoelectricity, a small, low-profile filter circuit with a steep bandpass characteristic curve is provided. Note that the substrate having piezoelectricity is a substrate at least whose surface has piezoelectricity. The substrate may preferably be, for example, a multilayer body that includes a piezoelectric thin film defining and functioning as a surface layer, a film having an acoustic velocity different from the piezoelectric thin film, and a support board. The substrate may preferably be, for example, a multilayer body that includes a high-acoustic-velocity support board and a piezoelectric thin film provided on the high-acoustic-velocity support board; a multilayer body that includes a high-acoustic-velocity support board, a low-acoustic-velocity film provided on the high-acoustic-velocity support board, and a piezoelectric thin film provided on the low-acoustic-velocity film; or a multilayer body that includes a support board, a high-acoustic-velocity film provided on the support board, a low-acoustic-velocity film provided on the high-acoustic-velocity film, and a piezoelectric thin film provided on the low-acoustic-velocity film. The entire substrate may have piezoelectricity. Resonators described below will not be explained in further detail, as they are the same or substantially the same as those described above.

In the present preferred embodiment, of the at least two parallel arm resonators, the parallel arm resonator p14 connected closest to the input/output terminal m12 has the highest anti-resonant frequency. Table 1 shows the anti-resonant frequencies of the parallel arm resonators in detail. Hereinafter, an example in which the parallel arm resonators have the anti-resonant frequencies shown in Table 1 is referred to as Exemplary Preferred Embodiment.

TABLE 1

|  | p11 | p12 | p13 | p14 |
|---|---|---|---|---|
| Exemplary Preferred Embodiment | 1950 MHz | 1969 MHz | 1970 MHz | 1978 MHz |

As shown in Table 1, in Exemplary Preferred Embodiment, the anti-resonant frequencies of the at least two parallel arm resonators (parallel resonators p11 to p14) are in ascending order, with the anti-resonant frequency of the parallel arm resonator p11 connected closest to the input/output terminal m11 being lowest and the anti-resonant frequency of the parallel arm resonator p14 connected closest to the input/output terminal m12 being highest. When the parallel arm resonators are SAW resonators, their anti-resonant frequencies are defined by the intervals of electrode fingers of the IDT electrodes. For example, the anti-resonant frequencies is able to be increased by narrowing the intervals.

The filter 10 includes the inductor L1 that is connected in series to the at least one series arm resonator, and is located closer to the input/output terminal m11 than the at least one series arm resonator and the two parallel arm resonators are to the input/output terminal m11. Specifically, as illustrated in FIG. 1, the inductor L1 is connected between the input/output terminal m11 and the node n1. The inductor L1 is a matching element that performs matching between the filter 10 and the switching circuit or other circuit connected to the antenna element.

Characteristics of a ladder filter, such as the filter illustrated in FIG. 1, will now be described. In design principle, the input and output impedances of a ladder filter are equal or substantially equal. For example, in the filter 10, impedance at the node n1 is equal or substantially equal to impedance at the node n4. This is because, unlike a longitudinally coupled filter, a ladder filter does not include an impedance conversion function.

In the longitudinally coupled filter, where input and output IDTs are separate, the input and output impedances are able to be relatively freely adjusted by making the impedances of the input and output IDTs different. However, the longitudinally coupled filter, which has less IDT pairs than the ladder filter, suffers disadvantages of high loss and susceptibility to surge breakdown.

In the ladder filter, where the input and output impedances are both defined by the same or substantially the same one-terminal-pair resonator, it is difficult to make them significantly different. However, the ladder filter is advantageous over the longitudinally coupled filter in that it has low loss and is resistant to surge breakdown. In preferred embodiments of the present invention, as described in detail below, the input and output impedances of the ladder filter, which has low loss and is resistant to surge breakdown, is able to be made different. Specifically, in preferred embodiments of the present invention, impedance at the input/output terminal m12 is able to be made higher than impedance at the input/output terminal m11.

The filter 20 is a transmission filter preferably having, for example, Band 25 Tx (about 1850 MHz to about 1915 MHz) of LTE as a pass band. The filter 20 is preferably, for example, a ladder acoustic wave filter. A PA is connected to the input/output terminal m22 of the filter 20.

The filter 20 includes series arm resonators s21 to s28 connected in a path between the input/output terminal m21 and the input/output terminal m22. The filter 20 also includes a parallel arm resonator p21 connected between the ground and a node between the series arm resonators s21 and s22, a parallel arm resonator p22 connected between the ground and a node between the series arm resonators s23 and s24, a parallel arm resonator p23 connected between the ground and a node between the series arm resonators s25 and s26, and a parallel arm resonator p24 connected between the ground and a node between the series arm resonators s27 and s28. The parallel arm resonators p21 to p23 are connected to the ground, with an inductor La interposed therebetween, and the parallel arm resonator p24 is connected to the ground, with an inductor Lb interposed therebetween. The inductor La connected in series to the parallel arm resonators p21 to p23 is able to shift the resonant frequencies of the parallel arm resonators p21 to p23, and the inductor Lb connected in series to the parallel arm resonator p24 is able to shift the resonant frequency of the parallel arm resonator p24. With this configuration, it is possible to adjust the band width of the pass band of the filter 20 and the band width of the attenuation band on the lower side of the pass band.

A relationship between the terminal impedance of the filter 10 and the filter characteristic will now be described with reference to FIGS. 2 to 7.

Figure 2:
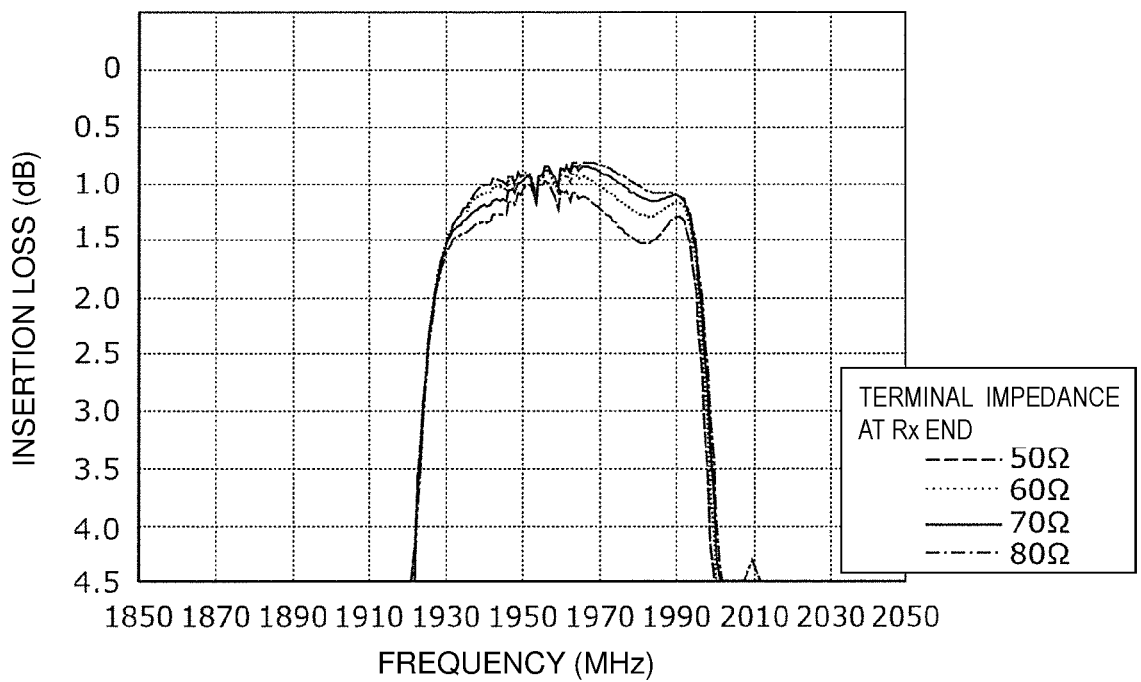
FIG. 2 is a graph showing bandpass characteristics of a filter obtained by varying the terminal impedance at the Rx end.

FIG. 2 is a graph showing bandpass characteristics of the filter 10 obtained by varying the terminal impedance at the Rx end. The terminal impedance at the Rx end refers to impedance as viewed from the input/output terminal m12. A broken line, a dotted line, a solid line, and a dash-dot line in FIG. 2 represent bandpass characteristics of the filter 10 obtained when the terminal impedances at the Rx end are about 50Ω, about 60Ω, about 70Ω, and about 80Ω in this order.

Figure 3:
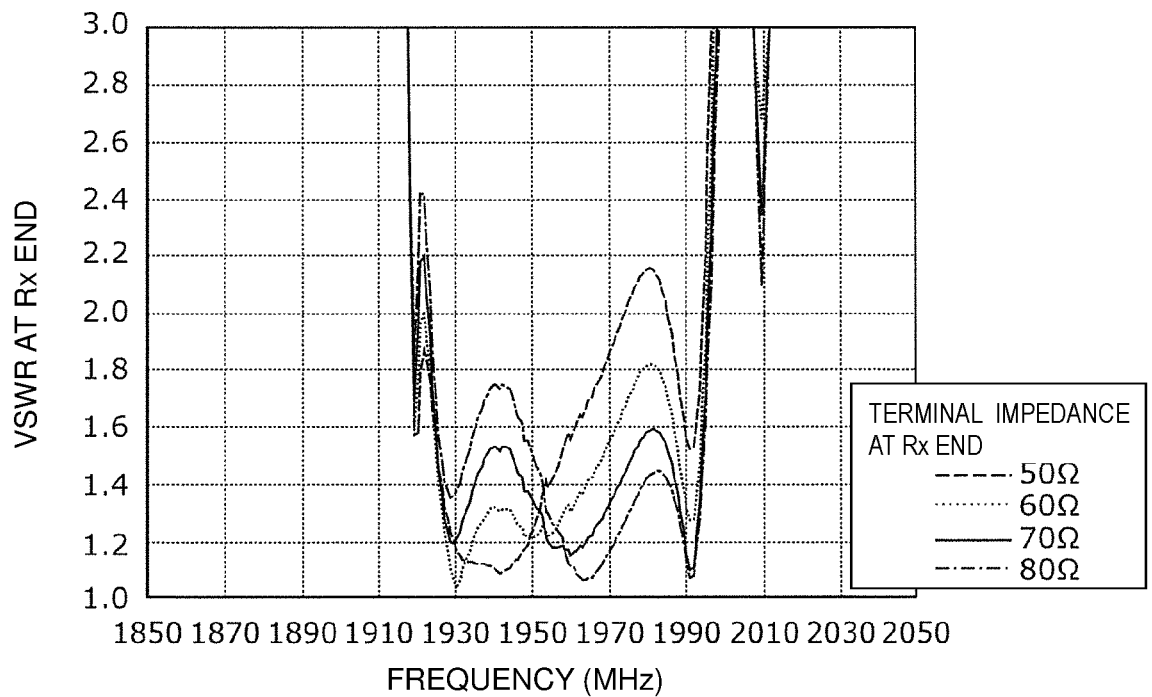
FIG. 3 is a graph showing VSWR characteristics at the Rx end obtained by varying the terminal impedance at the Rx end.

FIG. 3 is a graph showing VSWR characteristics at the Rx end obtained by varying the terminal impedance at the Rx end. A broken line, a dotted line, a solid line, and a dash-dot line in FIG. 3 represent VSWR characteristics at the Rx end obtained when the terminal impedances at the Rx end are about 50Ω, about 60Ω, about 70Ω, and about 80Ω in this order, for example.

FIGS. 2 and 3 show characteristics of the filter 10 in and around the pass band (about 1930 MHz to about 1995 MHz). To evaluate each of the characteristics obtained by varying the terminal impedance at the Rx end, the worst values in the pass band are compared.

Figure 4:
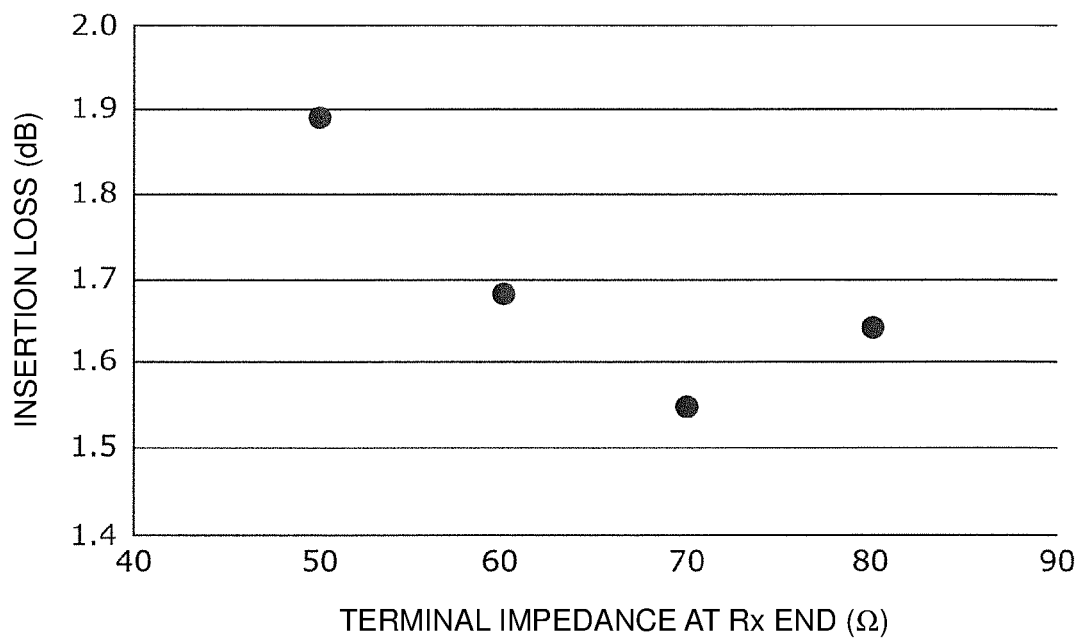
FIG. 4 is a graph that compares the worst insertion losses in the Rx pass band of the filter obtained by varying the terminal impedance at the Rx end.

FIG. 4 is a graph that compares the worst insertion losses in the Rx pass band of the filter 10 obtained by varying the terminal impedance at the Rx end. Note that since the filter 10 is a reception filter, the pass band of the filter 10 is also referred to as the Rx pass band.

Figure 5:
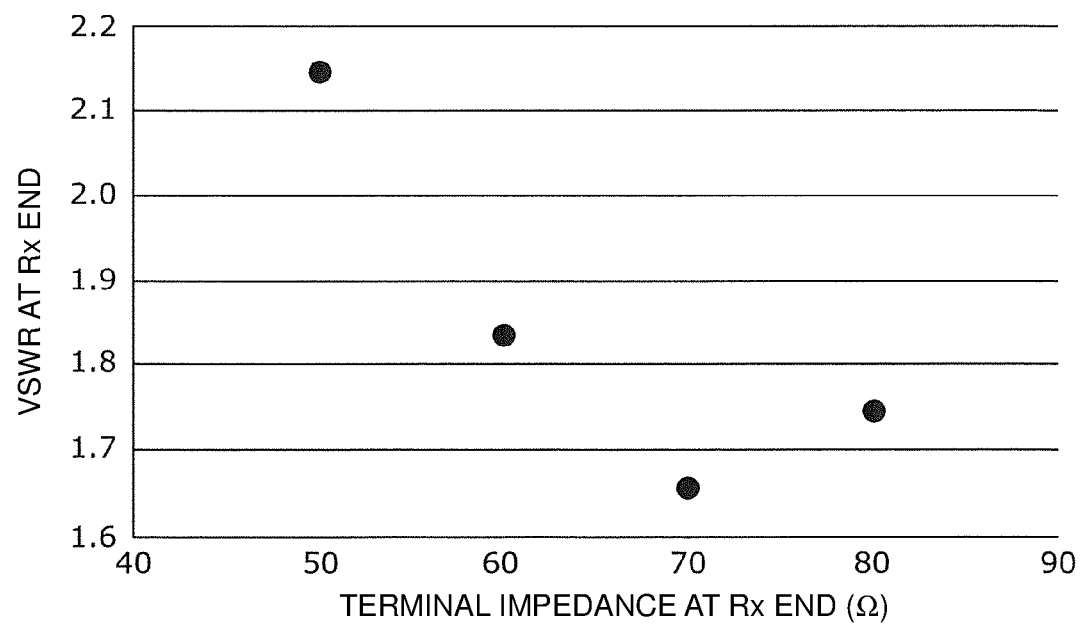
FIG. 5 is a graph that compares the worst VSWRs at the Rx end in the Rx pass band obtained by varying the terminal impedance at the Rx end.

FIG. 5 is a graph that compares the worst VSWRs at the Rx end in the Rx pass band obtained by varying the terminal impedance at the Rx end.

As described above, the LNA is connected to the input/output terminal m12 (Rx end), and the input impedance of the LNA is typically higher than about 50Ω and is often not less than about 65Ω, for example. In the present preferred embodiment, the input impedance of the LNA connected to the input/output terminal m12 is about 70Ω, for example.

Therefore, as shown in FIGS. 4 and 5, when the terminal impedance at the Rx end in the pass band of the filter 10 is about 70Ω, impedance matching between the filter 10 and the LNA is achieved in the pass band and both of the insertion loss and the VSWR are reduced or minimized.

Figure 6:
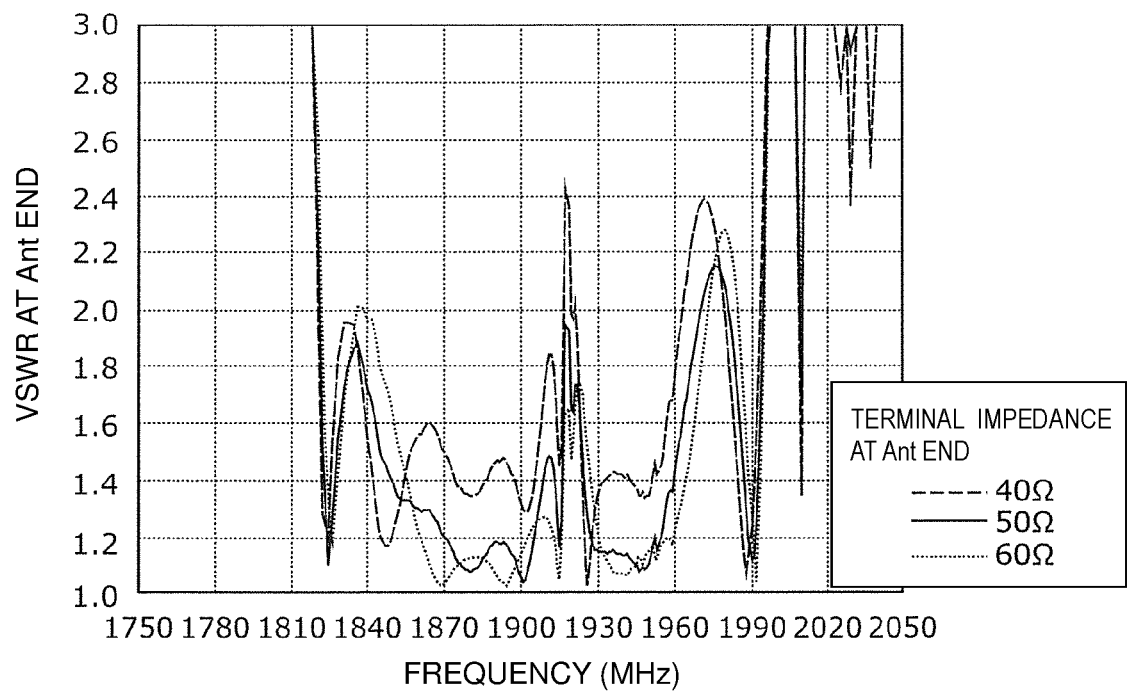
FIG. 6 is a graph showing VSWR characteristics at the Ant end obtained by varying the terminal impedance at the Ant end.

FIG. 6 is a graph showing VSWR characteristics at the Ant end obtained by varying the terminal impedance at the Ant end. The terminal impedance at the Ant end refers to impedance as viewed from the input/output terminal m11. A broken line, a solid line, and a dotted line in FIG. 6 represent VSWR characteristics at the Ant end obtained when the terminal impedances at the Ant end are about 40Ω, about 50Ω, and about 60Ω in this order, for example.

FIG. 6 shows VSWR characteristics in and around the pass band (about 1930 MHz to about 1995 MHz) of the filter 10 and in and around the pass band (about 1850 MHz to about 1915 MHz) of the filter 20. To evaluate each of the VSWR characteristics of the filter 10 obtained by varying the terminal impedance at the Rx end, the worst values in the pass band of the filter 10 are compared.

Figure 7:
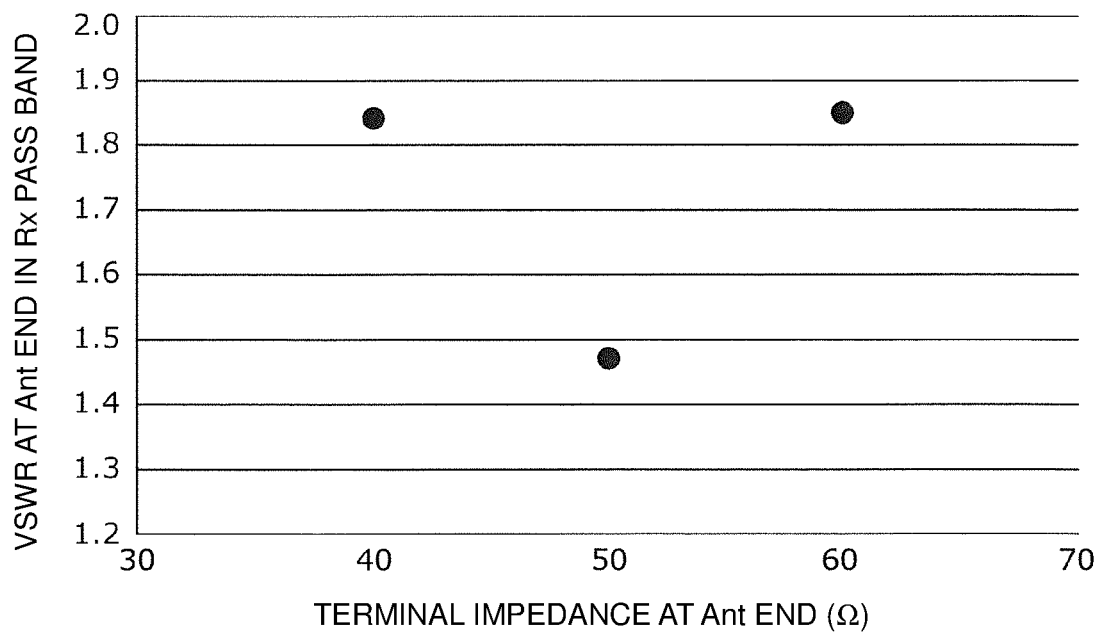
FIG. 7 is a graph that compares the worst VSWRs at the Ant end in the Rx pass band obtained by varying the terminal impedance at the Ant end.

FIG. 7 is a graph that compares the worst VSWRs at the Ant end in the Rx pass band obtained by varying the terminal impedance at the Ant end.

As described above, the switching circuit is connected to the common terminal m1 (Ant end). Typically, the output impedance of a switching circuit connected to an antenna element for radio communication is about 50Ω, for example. In the present preferred embodiment, the output impedance of the switching circuit connected to the common terminal m1 is about 50Ω, for example.

Therefore, as shown in FIG. 7, when the terminal impedance at the Ant end in the pass band of the filter 10 is about 50Ω, impedance matching between the filter 10 and the switching circuit is achieved in the pass band and the VSWR is reduced or minimized.

As described above, when the filter 10 is a reception filter and the LNA is connected thereto, it is necessary to make the impedance as viewed from one input/output terminal (input/output terminal m12) higher than the impedance as viewed from the other input/output terminal (input/output terminal m11) in accordance with the input impedance of the LNA.

The impedance characteristic of the filter 10 according to Exemplary Preferred Embodiment will now be described using FIGS. 8 and 9.

Figure 8:
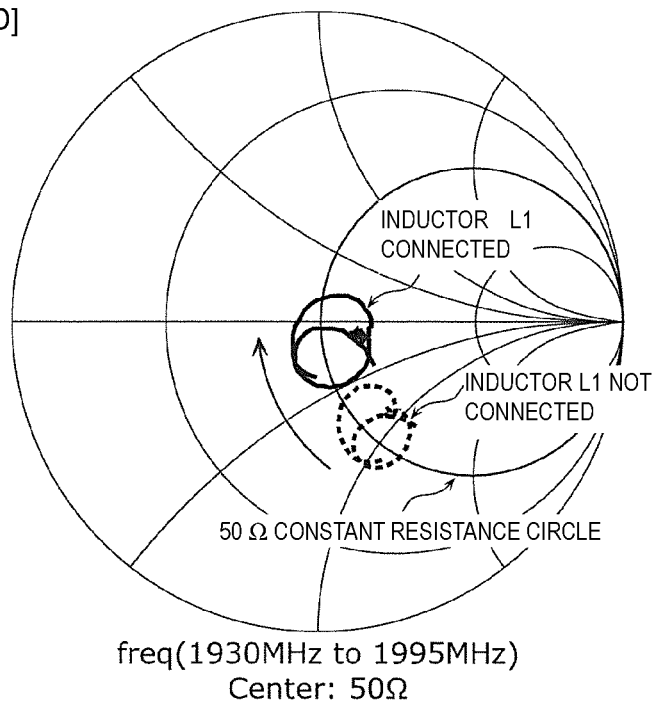
FIG. 8 is a Smith chart showing impedance characteristics at the Ant end of the filter that are obtained, with an inductor connected and not connected, according to an Exemplary Preferred Embodiment of the present invention.

FIG. 8 is a Smith chart showing impedance characteristics at the Ant end of the filter 10 that are obtained, with the inductor L1 connected and not connected, according to Exemplary Preferred Embodiment. In FIG. 8, a broken line represents an impedance characteristic obtained when the inductor L1 is not connected, and a solid line represents an impedance characteristic obtained when the inductor L1 is connected. Here, "the inductor L1 is not connected" means that the input/output terminal m11 and the node n1 are connected, without the inductor L1 therebetween. The Smith and admittance charts of FIG. 8 and subsequent drawings (mentioned below) show impedance characteristics in the about 1930 MHz to about 1995 MHz range, with about 50Ω at the center, for example.

The filter 10 is designed such that when the inductor L1 is not connected, the impedance at the Ant end is located, in the Smith chart of FIG. 8, at a position (indicated by the broken line in FIG. 8, at which impedance is capacitive) reached by moving along an approximately 50Ω constant resistance circle counterclockwise from a point at which reactance is about zero. Thus, when the inductor L1 is connected, the impedance at the Ant end in the pass band of the filter 10 moves clockwise along the approximately 50Ω constant resistance circle in the Smith chart to a position (indicated by the solid line in FIG. 8) at which resistance is about 50Ω and reactance is about zero. Although not shown, when the inductor L1 is connected, the impedance outside the pass band of the filter 10 (e.g., in the pass band of the filter 20) increases. This is because, with the inductor L1, the impedance in the pass band of the filter 20 significantly moves clockwise along the constant resistance circle in the Smith chart. As described above, the filter 10 is designed such that the impedance is capacitive when the inductor L1 is not connected. Thus, when the inductor L1 is connected, the impedance at the Ant end in the pass band of the filter 10 is about 50Ω and the impedance at the Ant end in the pass band of the filter 20 is higher (closer to be open).

Figure 9:
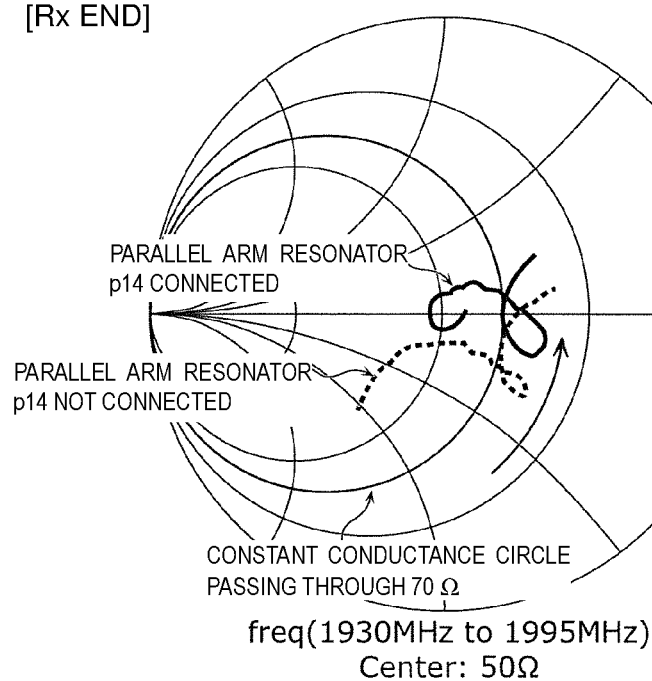
FIG. 9 is an admittance chart showing impedance characteristics at the Rx end of the filter that are obtained, with a first parallel arm resonator connected and not connected, according to Exemplary Preferred Embodiment of the present invention.

FIG. 9 is an admittance chart showing impedance characteristics at the Rx end of the filter 10 that are obtained, with the parallel arm resonator p14 connected and not connected, according to an Exemplary Preferred Embodiment. In FIG. 9, a broken line represents an impedance characteristic obtained when the parallel arm resonator p14 is not connected, and a solid line represents an impedance characteristic obtained when the parallel arm resonator p14 is connected. Here, "the parallel arm resonator p14 is not connected" means that the parallel arm resonator p14 is not connected between the node n4 and the ground.

As in FIG. 9, when the parallel arm resonator p14 is not connected, the impedance at the Rx end is located at a position (indicated by the broken line in FIG. 9, at which impedance is capacitive) reached by moving along an approximately 50Ω constant resistance circle in the Smith chart counterclockwise from a point at which reactance is about zero. This is because, as described above, the input and output impedances of a ladder filter are equal or substantially equal and specifically, in the filter 10, the impedance at the node n1 and the impedance at the node n4 are equal or substantially equal. In the admittance chart, the position described above is on a constant conductance circle that passes through a point at which resistance is higher than about 50Ω(e.g., about 70Ω) and reactance is about zero (hereinafter, this constant conductance circle is referred to as a "constant conductance circle passing through 70Ω").

On the other hand, when the parallel arm resonator p14 is connected, since a parallel arm resonator defines and functions as an inductive element, the impedance at the Rx end in the pass band of the filter 10 moves counterclockwise along the constant conductance circle passing through about 70Ω in the admittance chart to a position at which resistance is about 70Ω and reactance is about zero.

A comparison between the impedance of the filter 10 according to the Exemplary Preferred Embodiment and the impedance of a filter according to Comparative Example 1 will now be described using FIGS. 10 to 12. The filter of Comparative Example 1 has the same or substantially the same circuit configuration as the filter 10 of the Exemplary Preferred Embodiment, but differs in the anti-resonant frequencies of the parallel arm resonators.

Table 2 shows the anti-resonant frequencies of the parallel arm resonators of the filter according to Comparative Example 1 in detail.

TABLE 2

| | p11 | p12 | p13 | p14 |
|---|---|---|---|---|
| Comparative Example 1 | 1950 MHz | 1969 MHz | 1970 MHz | 1961 MHz |

As shown in Table 2, in Comparative Example 1, the anti-resonant frequency of the parallel arm resonator p13 is highest of the at least two parallel arm resonators (parallel arm resonators p11 to p14). That is, the parallel arm resonator p14 connected closest to the input/output terminal m12 does not have the highest anti-resonant frequency.

Figure 10:
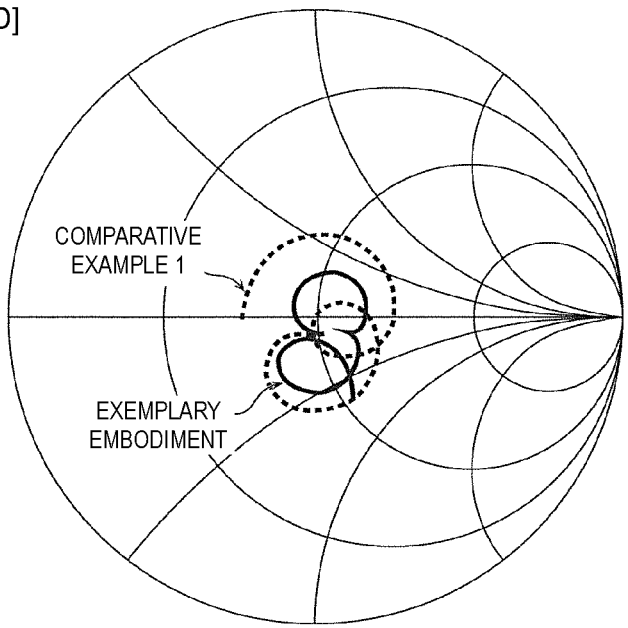
FIG. 10 is a Smith chart showing an impedance characteristic at the Ant end of each of the filters according to Exemplary Preferred Embodiment of the present invention and Comparative Example 1.

FIG. 10 is a Smith chart showing an impedance characteristic at the Ant end of each of the filters according to the Exemplary Preferred Embodiment and Comparative Example 1. FIG. 11 is a Smith chart showing an impedance characteristic at the Rx end of each of the filters according to the Exemplary Preferred Embodiment and Comparative Example 1. In both of FIGS. 10 and 11, a solid line represents the impedance characteristic of the filter 10 according to the Exemplary Preferred Embodiment and a broken line represents the impedance characteristic of the filter according to Comparative Example 1.

As shown in FIG. 10, the impedance at the Ant end in both of the Exemplary Preferred Embodiment and Comparative Example 1 is about 50Ω, which is optimal. On the other hand, as shown in FIG. 11, the impedance at the Rx end in Comparative Example 1 is more capacitive than that in Exemplary Preferred Embodiment and is about 60Ω, which is lower than that in the Exemplary Preferred Embodiment. This is because, in the pass band of these filters, the parallel arm resonator p14 tends to define and function as an inductive element in the Exemplary Preferred Embodiment, whereas the parallel arm resonator p14 tends to define and function as a capacitive element in Comparative Example 1. This will be described in detail using FIG. 12.

Figure 12:
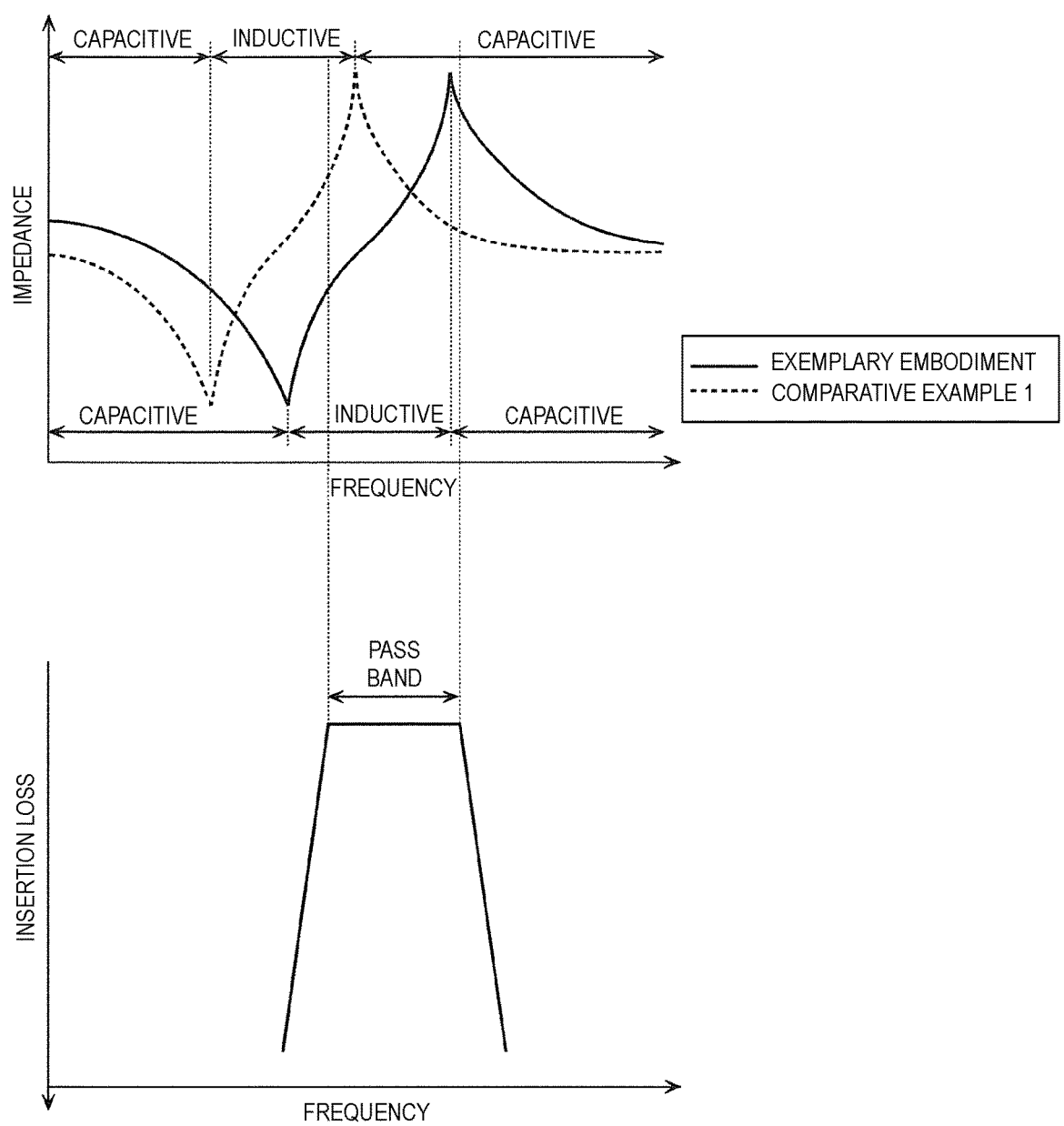
FIG. 12 is a diagram for explaining a frequency band in which a resonator defines and functions as an inductive element.

FIG. 12 is a diagram for explaining a frequency band in which a resonator defines and functions as an inductive element. The upper diagram of FIG. 12 is a graph that schematically illustrates the impedance characteristics of the parallel arm resonator p14 according to Exemplary Preferred Embodiment and Comparative Example 1. In FIG. 12, a solid line represents the impedance characteristic of the parallel arm resonator p14 according to the Exemplary Preferred Embodiment, and a broken line represents the impedance characteristic of the parallel arm resonator p14 according to Comparative Example 1. The lower diagram of FIG. 12 is a graph that schematically illustrates the bandpass characteristic of the filters according to the Exemplary Preferred Embodiment and Comparative Example 1.

The pass band of a ladder filter is defined by the resonant frequencies of series arm resonators included in the ladder filter and the anti-resonant frequencies of parallel arm resonators also included in the ladder filter. In the Exemplary Preferred Embodiment and Comparative Example 1, when focused only on the parallel arm resonators, the pass bands of the filters are both defined by the anti-resonant frequencies of the parallel arm resonators p11 to p14. In the Exemplary Preferred Embodiment, the anti-resonant frequency of the parallel arm resonator p14 is highest of those of the parallel arm resonators p11 to p14 and is located at the high end of the pass band as illustrated in FIG. 12. On the other hand, in Comparative Example 1, the anti-resonant frequency of the parallel arm resonator p14 is not highest of those of the parallel arm resonators p11 to p14 and is located on the lower side of the pass band than that in the Exemplary Preferred Embodiment.

A resonator defines and functions either as a capacitive or inductive element depending on the frequency. Specifically, a resonator defines and functions as a capacitive element in the frequency band higher than the anti-resonant frequency and in the frequency band lower than the resonant frequency, whereas it defines and functions as an inductive element in the frequency band ranging from the anti-resonant frequency to the resonant frequency. Therefore, when the anti-resonant frequency is located on the higher side of the pass band, the resonator tends to define and function as an inductive element in the pass band, whereas when the anti-resonant frequency is located on the lower side of the pass band, the resonator tends to define and function as a capacitive element in the pass band. As illustrated in FIG. 12, in the Exemplary Preferred Embodiment, where the pass band largely overlaps the frequency band ranging from the anti-resonant frequency to the resonant frequency, the parallel arm resonator p14 tends to define and function as an inductive element in the pass band, whereas in Comparative Example 1, where the pass band overlaps only a limited portion of the frequency band ranging from the anti-resonant frequency to the resonant frequency, the parallel arm resonator p14 tends to define and function as a capacitive element in the pass band.

Figure 11:
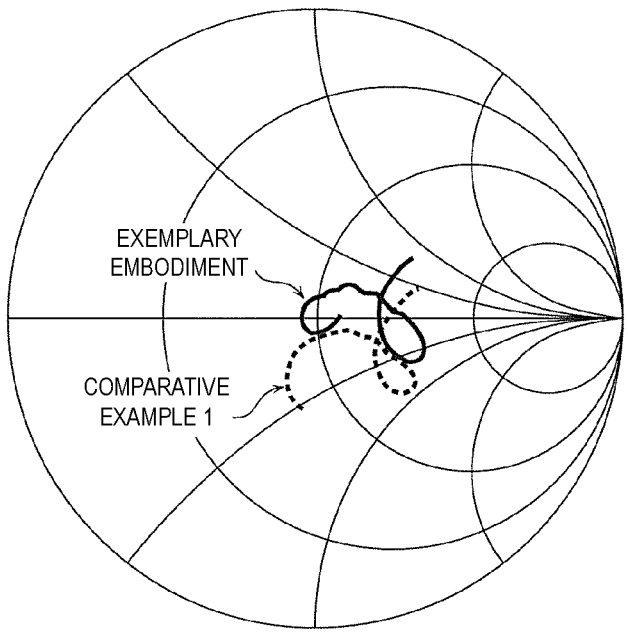
FIG. 11 is a Smith chart showing an impedance characteristic at the Rx end of each of the filters according to Exemplary Preferred Embodiment of the present invention and Comparative Example 1.

Thus, as in FIG. 11, in the Exemplary Preferred Embodiment, when the parallel arm resonator p14 that has the highest anti-resonant frequency and tends to produce a parallel inductor effect is connected, the impedance as viewed from the Rx end becomes inductive in the pass band and moves counterclockwise along the constant conductance circle passing through 70Ω, in the admittance chart to a position at which resistance is about 70Ω and reactance is about zero. In Comparative Example 1, when the parallel arm resonator p14 that has a lower anti-resonant frequency and tends to produce a parallel capacitor effect is connected, the impedance as viewed from the Rx end moves clockwise along the constant conductance circle passing through 70Ω in the admittance chart to a position at which the impedance is capacitive and low compared with that in the Exemplary Preferred Embodiment.

When, of the at least two parallel arm resonators, the parallel arm resonator p14 that is connected closest to the input/output terminal m12 (Rx end) and most significantly influences the impedance at the Rx end has the highest anti-resonant frequency, it is possible to make the impedance at the Rx end higher than the impedance at the Ant end. Thus, by using the inductor L1 with a simple configuration as a matching element and making the anti-resonant frequency of the parallel arm resonator p14 connected closest to the Rx end highest, it is possible to achieve impedance matching with the LNA having an input impedance higher than about 50Ω, for example.

Other features of Exemplary Preferred Embodiments will now be described.

As illustrated in FIG. 1, the input/output terminal m12 and the node n4 to which the parallel arm resonator p14 connected closest to the input/output terminal m12 are connected, with no series arm resonator interposed therebetween. If a series arm resonator, which includes an inductance component, is connected between the input/output terminal m12 and the node n4, the inductance component causes the impedance as viewed from the input/output terminal m12 (impedance at the Rx end) to move clockwise along the constant resistance circle in the Smith chart, and as a result, the impedance as viewed from the input/output terminal m12 is shifted to the lower impedance side by the moving amount. On the other hand, when the input/output terminal m12 and the node n4 to which the parallel arm resonator p14 is connected are connected, with no series arm resonator interposed therebetween, it is possible to make the impedance as viewed from the input/output terminal m12 higher.

Also, as in FIG. 1, the input/output terminal m11 and the node n1 to which the parallel arm resonator p11 connected closest to the input/output terminal m11 is connected are connected, with no series arm resonator interposed therebetween. When impedance outside the pass band of the filter 10 (e.g., in the pass band of the filter 20) is high, interference between the filter 10 and the filter 20 is able to be reduced or prevented. If any series arm resonator is connected between the node n1 and the input/output terminal m11, the impedance in the pass band of the filter 20 moves toward a capacitive phase. On the other hand, when the node n1 and the input/output terminal m11 are connected, with no series arm resonator interposed therebetween, the phase of the impedance does not change, and this makes it possible to further reduce the inductance value of the inductor L1. It is thus possible not only to reduce loss, but also to reduce the size of the filter 10.

As shown in Table 1, the anti-resonant frequencies of the parallel arm resonators p11 to p14 are in ascending order, with the anti-resonant frequency of the parallel arm resonator p11 connected closest to the input/output terminal m11 being lowest and the anti-resonant frequency of the parallel arm resonator p14 connected closest to the input/output terminal m12 being highest. Of the parallel arm resonators p11 to p14, a parallel arm resonator closer to the input/output terminal m12 more significantly influences the impedance as viewed from the input/output terminal m12 of the filter 10. Therefore, since a parallel arm resonator closer to the input/output terminal m12 has a higher anti-resonant frequency, the impedance as viewed from the input/output terminal m12 is able to be made higher.

Comparative Example 2 will now be described using FIGS. 13 to 15.

Figure 13:
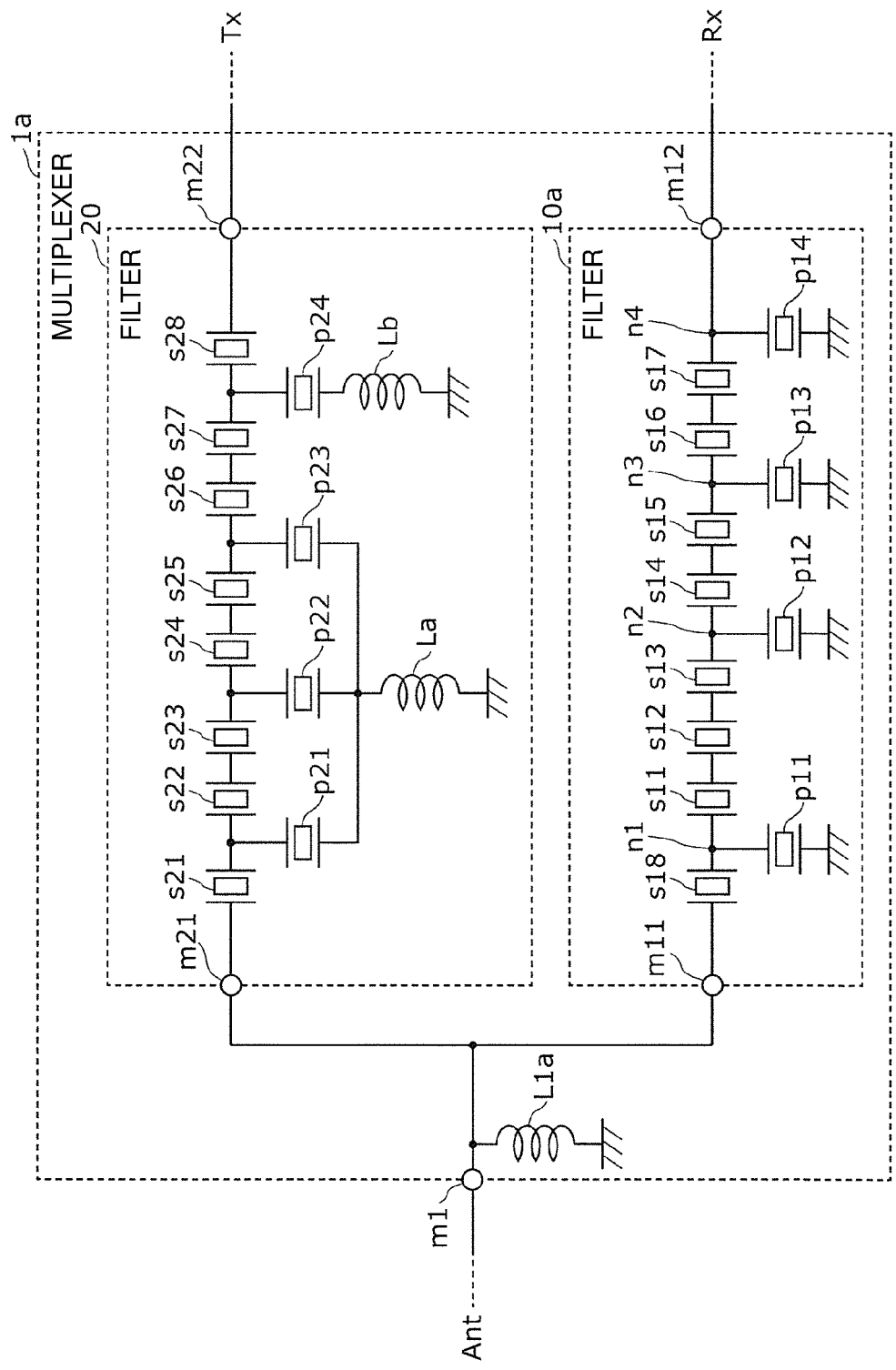
FIG. 13 is a circuit diagram of a multiplexer according to Comparative Example 2.

FIG. 13 is a circuit diagram of a multiplexer 1a according to Comparative Example 2. In Comparative Example 2, the multiplexer 1a includes an inductor L1a. The multiplexer 1a includes a filter 10a, instead of the filter 10 of the Exemplary Preferred Embodiment.

The filter 10a does not include the inductor L1. That is, the multiplexer 1a includes the inductor L1a, instead of the inductor L1. Although no series arm resonator is connected between the node n1 and the input/output terminal m11 in the filter 10 of the Exemplary Preferred Embodiment, a series arm resonator s18 is connected between the node n1 and the input/output terminal m11 in the filter 10a of Comparative Example 2. Although it is preferable that the node n1 and the input/output terminal m11 be connected, with no series arm resonator interposed therebetween, a series arm resonator may be connected as in the filter 10a.

Table 3 shows the anti-resonant frequencies of the parallel arm resonators of the filter 10a according to Comparative Example 2 in detail.

TABLE 3

| | p11 | p12 | p13 | p14 |
|---|---|---|---|---|
| Comparative Example 2 | 1950 MHz | 1972 MHz | 1957 MHz | 1980 MHz |

As shown in Table 3, the anti-resonant frequency of the parallel arm resonator p14 is highest of those of the parallel arm resonators p11 to p14, as in the case of the Exemplary Preferred Embodiment. As described above, it is preferable that the anti-resonant frequencies of the parallel arm resonators p11 to p14 be in ascending order, with the anti-resonant frequency of the parallel arm resonator p11 being lowest and the anti-resonant frequency of the parallel arm resonator p14 being highest. However, as in Comparative Example 2, the anti-resonant frequencies of the parallel arm resonators p11 to p14 do not necessarily need to be in ascending order.

The other aspects of the multiplexer 1a will not be described, as they are the same or substantially the same as those of the multiplexer 1 of the Exemplary Preferred Embodiment.

The inductor L1a is connected between the common terminal m1 and the input/output terminals m11 and m21. The inductor L1a is a matching element that performs matching between, for example, a switching circuit connected to the antenna element and the filters 10a and 20. Although matching at the Ant end is obtained by the inductor L1 in the Exemplary Preferred Embodiment, it may be obtained by the inductor L1a as in Comparative Example 2.

Figure 14:
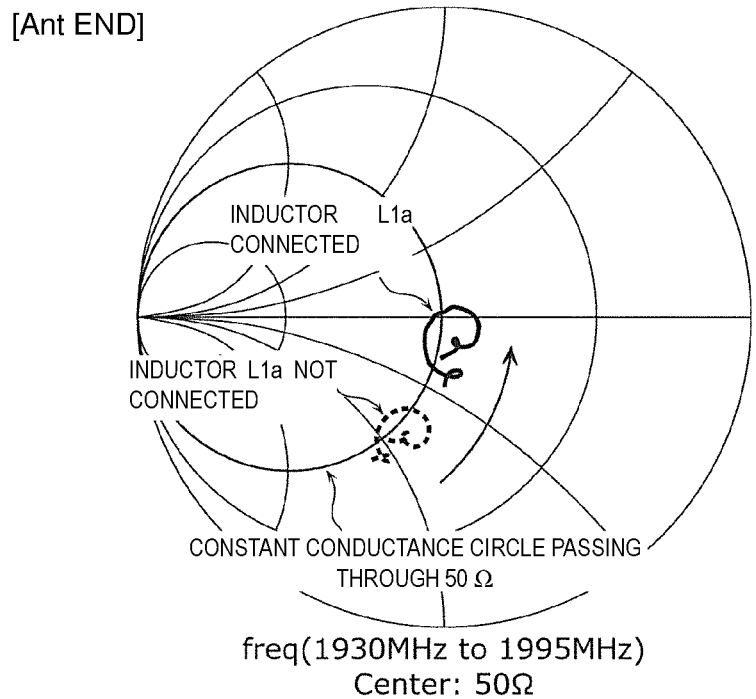
FIG. 14 is an admittance chart showing impedance characteristics at the Ant end of a filter that are obtained, with an inductor connected and not connected, according to Comparative Example 2.

FIG. 14 is an admittance chart showing impedance characteristics at the Ant end of the filter 10a that are obtained, with the inductor L1a connected and not connected, according to Comparative Example 2. In FIG. 14, a broken line represents an impedance characteristic obtained when the inductor L1a is not connected, and a solid line represents an impedance characteristic obtained when the inductor L1a is connected. Here, "the inductor L1a is not connected" means that the inductor L1a is not connected between the path connecting the common terminal m1 to the input/output terminal m11 or m21 and the ground.

The filter 10a is designed such that when the inductor L1a is not connected, the impedance at the Ant end is located, in the admittance chart of FIG. 14, at a position (indicated by the broken line FIG. 14, at which impedance is capacitive) reached by moving along a constant conductance circle that passes through a point at which resistance is about 50Ω and reactance is about zero (hereinafter, this constant conductance circle is also referred to as "constant conductance circle passing through 50Ω") clockwise from a point at which resistance is about 50Ω and reactance is about zero. Thus, when the inductor L1a is connected, the impedance at the Ant end in the pass band of the filter 10a moves counterclockwise along the constant conductance circle passing through about 50Ω in the admittance chart to a position at which resistance is about 50Ω and reactance is about zero (as indicated by the solid line in FIG. 14).

Figure 15:
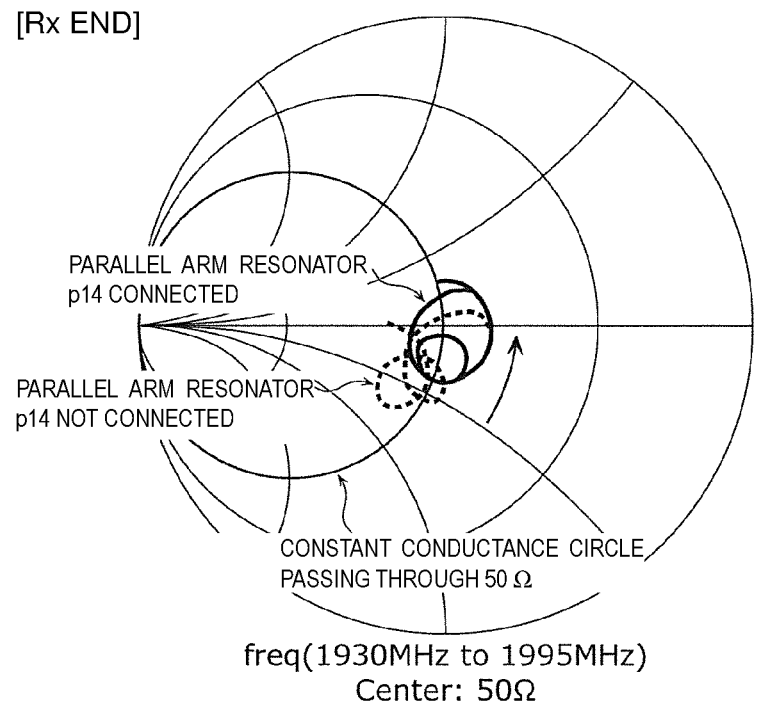
FIG. 15 is an admittance chart showing impedance characteristics at the Rx end of the filter that are obtained, with a first parallel arm resonator connected and not connected, according to Comparative Example 2.

FIG. 15 is an admittance chart showing impedance characteristics at the Rx end of the filter 10a that are obtained, with the parallel arm resonator p14 connected and not connected, according to Comparative Example 2. In FIG. 15, a broken line represents an impedance characteristic obtained when the parallel arm resonator p14 is not connected, and a solid line represents an impedance characteristic obtained when the parallel arm resonator p14 is connected.

As in FIG. 15, when the parallel arm resonator p14 is not connected, the impedance at the Rx end is located at a position (indicated by the broken line in FIG. 15, at which impedance is capacitive) reached by moving clockwise along a constant conductance circle passing through 50Ω in the admittance chart from a point where resistance is about 50Ω and reactance is about zero. This is because, as described above, the input and output impedances of a ladder filter are equal or substantially equal and specifically, in the filter 10a, the impedance at the node n1 and the impedance at the node n4 are equal or substantially equal.

On the other hand, when the parallel arm resonator p14 is connected, the impedance at the Rx end in the pass band of the filter 10a moves counterclockwise along the constant conductance circle passing through about 50Ω in the admittance chart to a position (indicated by the solid line in FIG. 15) at which resistance is about 50Ω and reactance is about zero.

A comparison between the impedance of the filter 10 according to the Exemplary Preferred Embodiment and the impedance of the filter 10a according to Comparative Example 2 will now be described using FIGS. 16 and 17.

Figure 16:
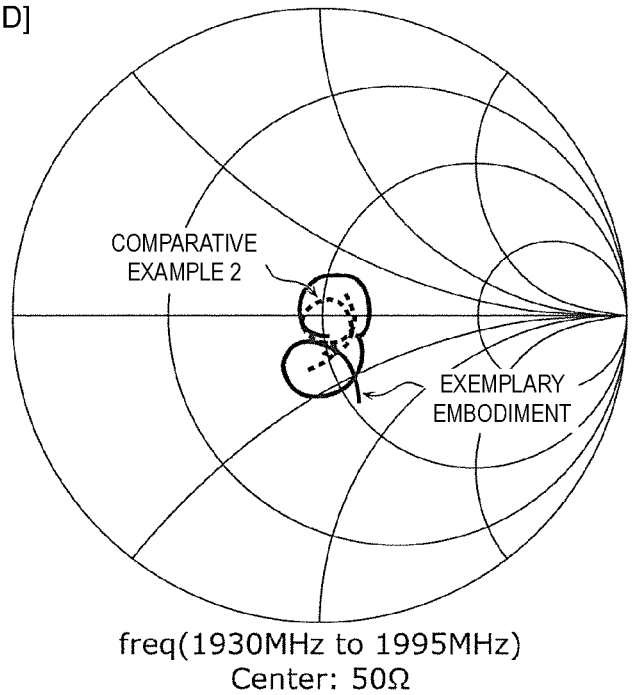
FIG. 16 is a Smith chart showing an impedance characteristic at the Ant end of each of the filters according to Exemplary Preferred Embodiment of the present invention and Comparative Example 2.
Figure 17:
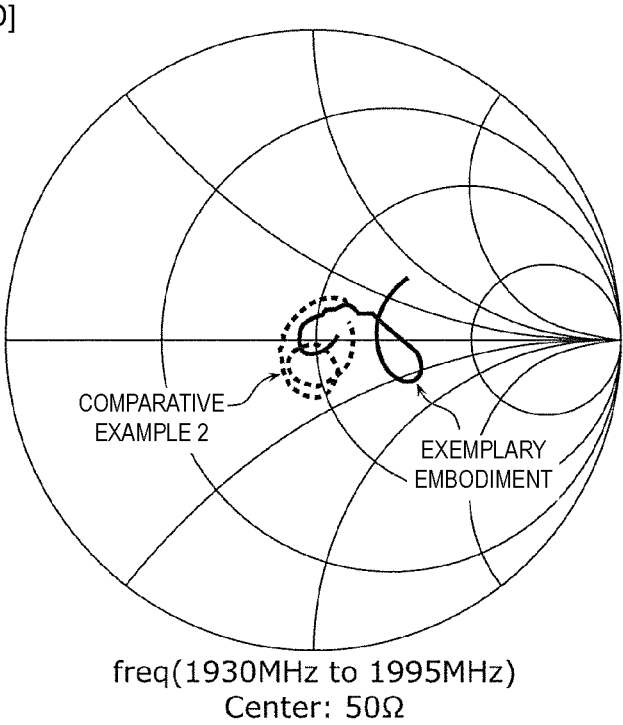
FIG. 17 is a Smith chart showing an impedance characteristic at the Rx end of each of the filters according to Exemplary Preferred Embodiment of the present invention and Comparative Example 2.

FIG. 16 is a Smith chart showing an impedance characteristic at the Ant end of each of the filters according to the Exemplary Preferred Embodiment and Comparative Example 2. FIG. 17 is a Smith chart showing an impedance characteristic at the Rx end of each of the filters according to the Exemplary Preferred Embodiment and Comparative Example 2. In both of FIGS. 16 and 17, a solid line represents the impedance characteristic of the filter 10 according to the Exemplary Preferred Embodiment and a broken line represents the impedance characteristic of the filter 10a according to Comparative Example 2.

As shown in FIG. 16, the impedance at the Ant end in both the Exemplary Preferred Embodiment and Comparative Example 2 is about 50Ω, which is optimal. As for the impedance at the Rx end, as shown in FIG. 17, although the reactance in Comparative Example 2 is about zero as in the case of the Exemplary Preferred Embodiment, the resistance in Comparative Example 2 is about 50Ω, which is lower than the resistance (about 70Ω) in the Exemplary Preferred Embodiment. This is because the filter 10a is designed such that before the inductor L1a is connected, the impedance of the filter 10a is located, in the admittance chart, at a position (where impedance is capacitive) reached by moving clockwise along a constant conductance circle passing through about 50Ω from a point where resistance is about 50Ω and reactance is about zero. The position described above is a position at which resistance is lower than about 50Ω. Even if the parallel arm resonator p14 having a high anti-resonant frequency is connected to move the impedance at the Rx end counterclockwise along the constant conductance circle from this position, the impedance at the Rx end does not become higher than about 50Ω, for example.

In Comparative Example 2 where the inductor L1a is used instead of the inductor L1, even though the parallel arm resonator p14 having the highest anti-resonant frequency is connected, it is difficult to make the impedance at the Rx end higher than the impedance at the Ant end. In Comparative Example 2, the impedance at the Rx end and the impedance at the Ant end are equal or substantially equal. Therefore, even when the design is changed to make the impedance at the Rx end higher than about 50Ω, the impedance at the Ant end also becomes higher than about 50Ω and it is difficult to achieve optimal impedances at both the Ant end and the Rx end.

As described above, of the parallel arm resonators p11 to p14 included in the filter 10, the parallel arm resonator p14 is closest to the input/output terminal m12 and most significantly influences the impedance as viewed from the input/output terminal m12 of the filter 10. Also, since the anti-resonant frequency of the parallel arm resonator p14 is highest of the parallel arm resonators p11 to p14, the parallel arm resonator p14 defines and functions as an inductive element in most portions of the pass band of the filter 10.

The filter 10 is designed such that the impedance of the filter 10 is capacitive before the inductor L1 and the parallel arm resonator p14 are connected. Specifically, the filter 10 is designed such that in the Smith chart, the impedance is located at a position reached by moving along, for example, an approximately 50Ω constant resistance circle counterclockwise from a point at which reactance is about zero. In other words, the filter 10 is designed such that in the admittance chart, the impedance is located on a constant conductance circle passing through a point at which resistance is higher than about 50Ω and reactance is about zero. Thus, when the inductor L1 is connected, the impedance as viewed from the input/output terminal m11 moves clockwise along the 50Ω constant resistance circle in the Smith chart to a position at which resistance is about 50Ω and reactance is about zero. Also, when the parallel arm resonator p14 is connected, the impedance as viewed from the input/output terminal m12 moves counterclockwise along the constant conductance circle passing through a point at which resistance is higher than about 50Ω and reactance is about zero in the admittance chart to a position where resistance is higher than about 50Ω (e.g., about 70 S2) and reactance is about zero. This simply involves using the inductor L1 as a matching element. Thus, with a less complex matching element, the impedance as viewed from one input/output terminal m12 is able to be made higher than the impedance as viewed from the other input/output terminal m11. Specifically, the resistance of the impedance as viewed from the input/output terminal m12 is able to be made higher than about 50Ω and the reactance of the impedance as viewed from the input/output terminal m12 is able to be made about zero. This facilitates impedance matching between, for example, the filter 10 and an LNA.

Although high-frequency filters (filter 10) and multiplexers 1 according to the present invention have been described with reference to some preferred embodiments, it is to be understood that the present invention is not limited to the preferred embodiments described above. The present invention also includes other preferred embodiments obtained by combining any of the elements provided in the preferred embodiments described above, various modified preferred embodiments obtained by making various changes conceived by those skilled in the art without departing from the spirit of the present invention, and various devices that include the filter 10 and the multiplexer 1 according to preferred embodiments of the present invention.

For example, the multiplexer 1, which is preferably a duplexer, for example, in the preferred embodiments described above, may be a triplexer or quadplexer.

Also, for example, although the pass band of the filter 10 is preferably Band 25 Rx (about 1930 MHz to about 1995 MHz) of LTE and the pass band of the filter 20 is preferably Band 25 Tx (about 1850 MHz to about 1915 MHz) of LTE in the preferred embodiments described above, these are merely examples and are determined appropriately in accordance with required specifications. The filter 20, which is preferably a transmission filter in the foregoing preferred embodiments, may be a reception filter. The filter 20, which is preferably a ladder acoustic wave filter in the foregoing preferred embodiments, may be an LC filter.

The high-frequency filters and the multiplexers according to preferred embodiments of the present invention, which are applicable to multiband systems, may be widely used in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency ladder filter, comprising:
    at least one series arm resonator connected in a path between a first input/output terminal and a second input/output terminal;
    at least two parallel arm resonators each connected between a connection node in the path and a ground; and
    an inductor connected in series to the at least one series arm resonator, the inductor being closer to the first input/output terminal than the at least one series arm resonator and the at least two parallel arm resonators are to the first input/output terminal; wherein
    of the at least two parallel arm resonators, a first parallel arm resonator connected closest to the second input/output terminal has a highest anti-resonant frequency; and
    the first input/output terminal and the connection node to which one of the at least two parallel arm resonators is connected, the one being connected closest to the first input/output terminal, are connected, with none of the at least one series arm resonator interposed therebetween.

2. The high-frequency filter according to claim 1, wherein the second input/output terminal and the connection node to which the first parallel arm resonator is connected are connected, with none of the at least one series arm resonator interposed therebetween.

3. The high-frequency filter according to claim 1, wherein anti-resonant frequencies of the at least two parallel arm resonators are in ascending order, with the anti-resonant frequency of one parallel arm resonator of the at least two parallel arm resonators connected closer to the second input/output terminal being higher than the anti-resonant frequency of another parallel arm resonator of the at least two parallel arm resonators connected closer to the first input/output terminal.

4. The high-frequency filter according to claim 1, wherein the at least one series arm resonator and the at least two parallel arm resonators are surface acoustic wave resonators.

5. A multiplexer comprising:
    a plurality of filters including the high-frequency filter according to claim 1; wherein
    the plurality of filters are each directly or indirectly connected, at one input/output terminal thereof, to a common terminal.

6. The multiplexer according to claim 5, wherein an antenna element is connected to the common terminal.

7. The multiplexer according to claim 5, wherein the second input/output terminal and the connection node to which the first parallel arm resonator is connected are connected, with none of the at least one series arm resonator interposed therebetween.

8. The multiplexer according to claim 5, wherein anti-resonant frequencies of the at least two parallel arm resonators are in ascending order, with the anti-resonant frequency of one parallel arm resonator of the at least two parallel arm resonators connected closer to the second input/output terminal being higher than the anti-resonant frequency of another parallel arm resonator of the at least two parallel arm resonators connected closer to the first input/output terminal.

9. The multiplexer according to claim 5, wherein the at least one series arm resonator and the at least two parallel arm resonators are surface acoustic wave resonators.

10. The multiplexer according to claim 5, wherein
    the plurality of filters include a reception filter and a transmission filter; and
    the reception filter is defined by the high-frequency filter.

11. The multiplexer according to claim 10, wherein the reception filter has a Band 25 Rx of Long-Term Evolution as a pass band.

12. The multiplexer according to claim 10, wherein the transmission filter is a ladder acoustic wave filter.

13. The multiplexer according to claim 5, wherein the plurality of filters have different pass bands.

* * * * *